United States Patent [19]
Nyseth

[11] Patent Number: 5,711,427
[45] Date of Patent: Jan. 27, 1998

[54] WAFER CARRIER WITH DOOR

[75] Inventor: David L. Nyseth, Plymouth, Minn.

[73] Assignee: Fluoroware, Inc., Chaska, Minn.

[21] Appl. No.: 678,885

[22] Filed: Jul. 12, 1996

[51] Int. Cl.[6] ................................................ B65D 85/30
[52] U.S. Cl. .......................... 206/710; 206/454; 414/217; 414/292
[58] Field of Search ........................ 206/454, 710, 206/711, 722, 725, 832; 141/98; 414/219, 292, 404, 407; 220/323

[56] References Cited

U.S. PATENT DOCUMENTS

| 4,534,389 | 8/1985 | Tullis. | |
|---|---|---|---|
| 4,674,939 | 6/1987 | Maney et al. | |
| 4,739,882 | 4/1988 | Parikh et al. | |
| 4,815,912 | 3/1989 | Maney et al. | |
| 4,995,430 | 2/1991 | Bonora et al. | 414/292 |
| 5,482,161 | 1/1996 | Williams et al. | 414/217 |
| 5,555,981 | 9/1996 | Gregerson | 206/711 |
| 5,628,683 | 5/1997 | Gentischer | 414/217 |

FOREIGN PATENT DOCUMENTS

WO90/14273  11/1990  WIPO.

*Primary Examiner*—David T. Fidei
*Attorney, Agent, or Firm*—Palmatier, Sjoquist, Helget & Voigt, P.A.

[57] ABSTRACT

A wafer container has an open front defined by a door frame and a door sized for the door frame. The door receiving frame has slots on opposite sides and the door utilizes latching portions that extend and retract from the edge portion of the door into and out of the slots for latching and unlatching the door on the door receiving frame. The door also has wafer engaging arms which extend inwardly toward the wafers to secure said wafers when the door is in place. The retractable latching portions and wafer retaining arms are linked to a rotatable cammed member in the interior of the door. The cammed member utilizes cammed surfaces configured to first latch the door and to then extend the wafer retaining arms.

9 Claims, 10 Drawing Sheets

WAFER CARRIER WITH DOOR

BACKGROUND OF THE INVENTION

This invention relates to wafer carriers. More particularly it relates to wafer containers that have a cover or door to enclose the wafers in the container.

Various methods have been utilized to enclose wafers in containers for storage or shipping. Some containers have utilized vertical slots for the wafers and snap on top covers or lids of resiliently flexible plastic. Passive cushions attached to the top cover are deflected when engaging the wafers as the top cover was applied.

The semiconductor industry has evolved into processing larger wafers, up to 300 mm in diameter, and is moving toward carriers and transport containers with exclusively horizontal wafer positioning. The larger containers necessary for holding the larger wafers make conventional passive resiliently flexible cushions difficult to fabricate and use.

SUMMARY OF THE INVENTION

A wafer container has an open front defined by a door receiving frame and a door sized for the door receiving frame. The door receiving frame has slots on opposite sides and the door utilizes latching portions that extend and retract from the edge portion of the door into and out of the slots for latching and unlatching the door on the door receiving frame. The door also has wafer engaging arms which extend inwardly toward the wafers to secure said wafers when the door is in place. The retractable latching portions and wafer retaining arms are linked to a rotatable cammed member in the interior of the door. The cammed member utilizes cammed surfaces configured to first latch the door and to then extend the wafer retaining arms.

An advantage and feature of the invention is that the door also provides wafer retention in addition to latching of the door. Said latching and retention is provided by a single rotational motion of a door handle.

Another feature and advantage of the invention is that the mechanism is positioned in the interior of the door thereby minimizing the generation and dispersal of particles by the door mechanism.

Another feature and advantage of the invention is that the door mechanism provides the latching and wafer retention in an appropriate sequence.

Another feature and advantage of the invention is that the cammed surfaces in the rotatable cammed member may include a detent to easily and simply secure the door in the latched position and to secure the wafer retaining arm in the engagement position.

DETAILED DESCRIPTION

Figure 1:
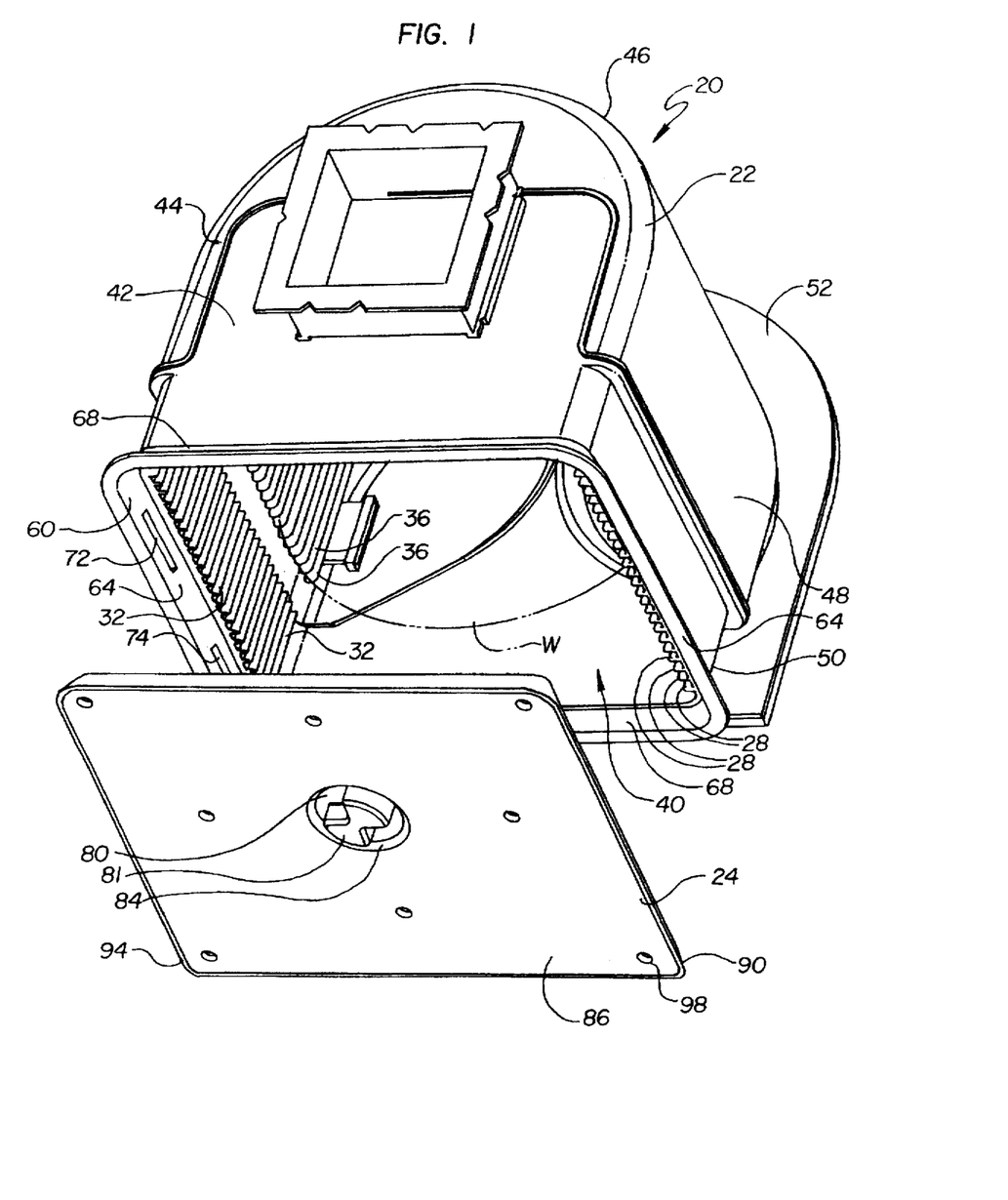
FIG. 1 is a perspective view of a wafer container and door.

Referring to FIG. 1 a wafer container 20 generally comprised of a container portion 22 and a cooperating door 24. The container portion has a plurality of wafer slots 28 for insertion and removal of wafers W in substantially horizontal planes. The slots are defined by the wafer guides 32 and the wafer support shelves 36. The container portion generally has an open front 40, a closed top 42, a closed left side 44, a closed back side 46, and a closed right side 48 and a closed bottom 50. The container is shown positioned on an equipment interface 52.

The door 24 seats into and engages with a door receiving frame 60. Door frame 60 has two pairs of opposing frame members, a vertical pair 64 and a horizontal pair 68. The vertical frame members have a pair of apertures or slots 72, 74 which are utilized in engaging and latching the door to the container portion 22. The door has a centrally located rotatable member 80 with a manual or robotic handle 81 set in a recess 84 in the front cover 86. The front cover 86 is part of the door enclosure 90 which also includes the door edge portion 94 and a back panel 96 not shown in this view. The front cover 86 is fastened with suitable mechanical fasteners 98.

Figure 2:
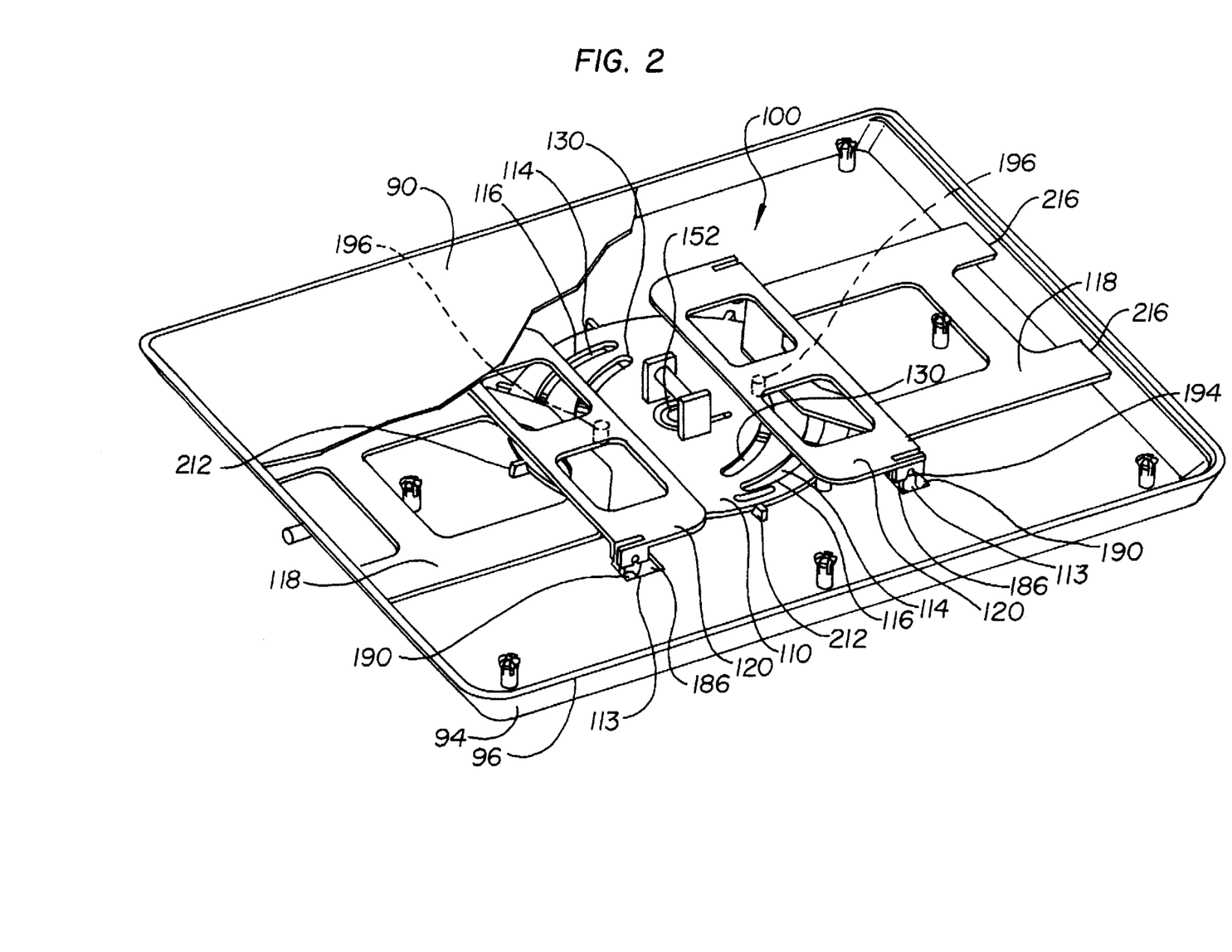
FIG. 2 is a perspective view of the wafer container door with a portion of the front cover removed exposing the mechanism.

FIG. 2 shows a perspective view of the door 20 with a portion of the front cover 86 removed revealing the door mechanism 100. Individual components of the mechanism are shown in FIGS. 3, 4, 5, and 6 and comprise a rotatable cammed member 110, a wafer engaging arm 112 with attached bell cranks 113 and a latching arm 118 and a wafer engaging arm actuator link 120.

Figure 3:
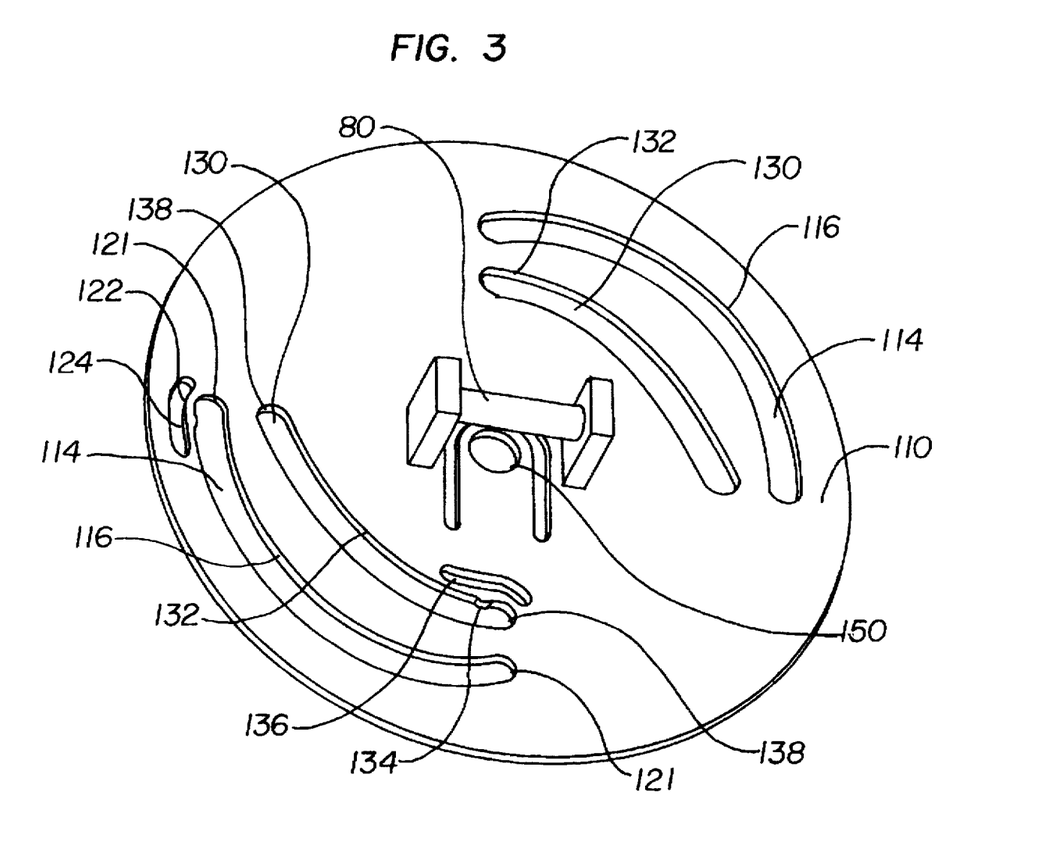
FIG. 3 is a perspective view of the rotatable cam member.

Referring to FIGS. 2 and 3, the rotatable cammed member 110 has a pair of latching arm cam apertures 114 forming cam surfaces 116. The cam apertures 114 have opposing ends 123 with a detent 122 formed at an end by way of a protrusion of plastic. The detent 122 is made flexibly resilient by the addition of a detent aperture 124. The rotatable cam member 110 also has a pair of opposite wafer engaging cam apertures 130 which forms a wafer engaging cammed surfaces 132. Further a wafer engaging cam detent 134 is provided by a protrusion in one of the cam surfaces 132 and is made resiliently flexible by way of a detent aperture 136 adjacent an end 138 of the wafer engaging cam aperture 130. The rotatable cam member has a central bore 150 used to position and secure the rotatable cammed member 110 onto the rear panel 96 of the door by shaft 152.

Figure 4:
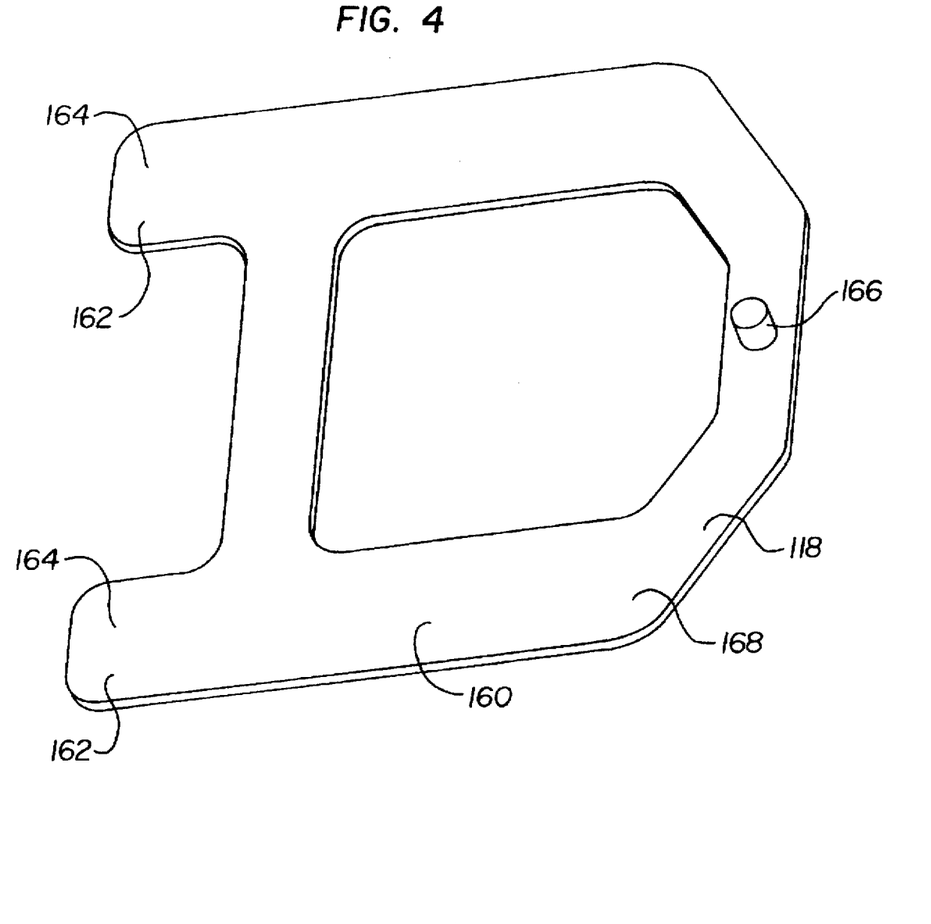
FIG. 4 is a perspective view of a latching arm.

Referring to FIGS. 2 and 4, each latching arm 118 comprises a linking portion 160 and a pair of extendable portions 162 which include a latching portion 164 which is configured to engage in the recesses or apertures 72, 74 in the door receiving frame 60. Each latching arm also has a cam follower 166 formed as a shaft or projection from the generally planar portion 168 of the arm 118.

Figure 5:
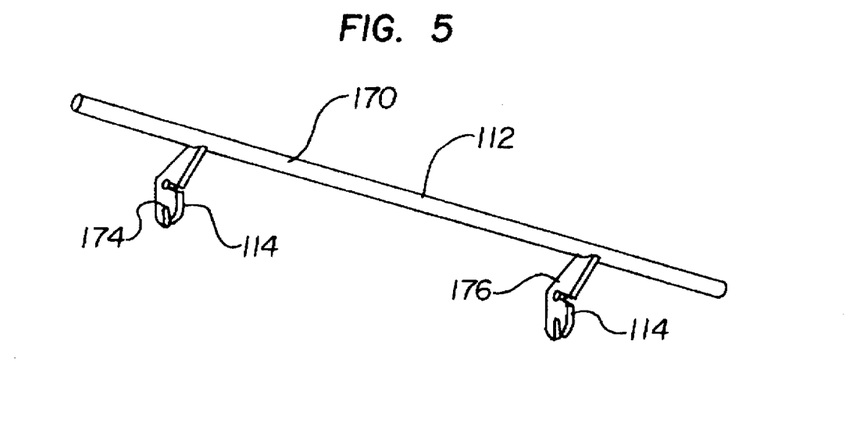
FIG. 5 is a perspective view of a wafer engaging arm.
Figures 6, 7:
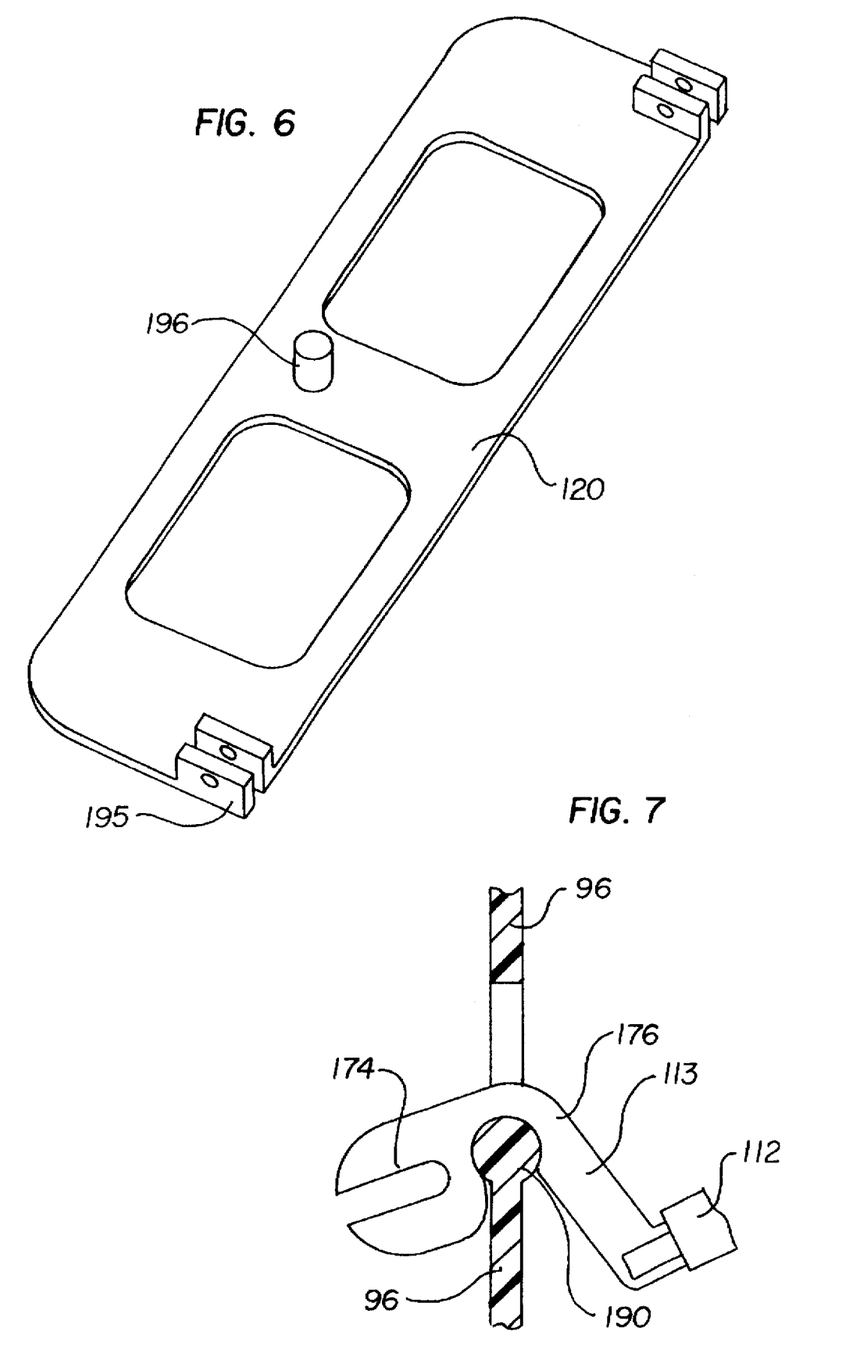
FIG. 6 is a perspective view of a wafer engaging arm actuator link.
FIG. 7 is a cross-sectional view of a bell crank engaged with the rear panel.
Figure 8:
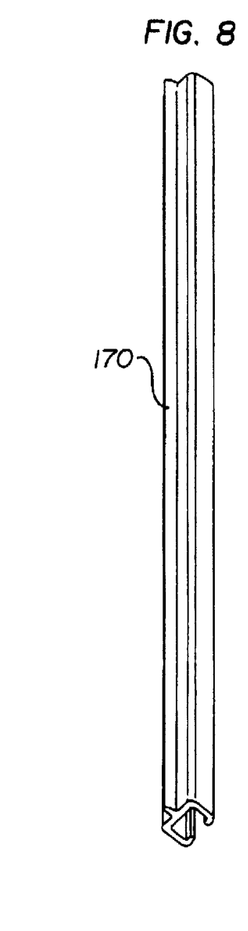
FIG. 8 is a perspective view of a wafer engaging portion.

Referring to FIGS. 5, 7 and 8, each wafer engaging arm 112 is comprised of a wafer edge engaging portion 170, the bell cranks 113 with a connecting slot 174 and a pivot surface 176. The wafer edge engaging portion 170 is suitably formed of Hytrel.

Referring to FIG. 6 the wafer engaging arm actuator link 120 is shown and has a cam follower 196 and hinges 195.

The latching arms 118 are positioned between the rotatable cammed member 110 and the actuator link 120. The latching portions are sized to slidably extend and retract through the slots 216 in the door edge portion 94. The cam followers 166 extend into the cam follower aperture 118 and further into the back panel groove 200. The top cover is assembled on the door edge portion 94 to form the door enclosure 90. The relatively limited space between the front panel and back panel operate to stabilize and retain the mechanism 100.

Figure 9:
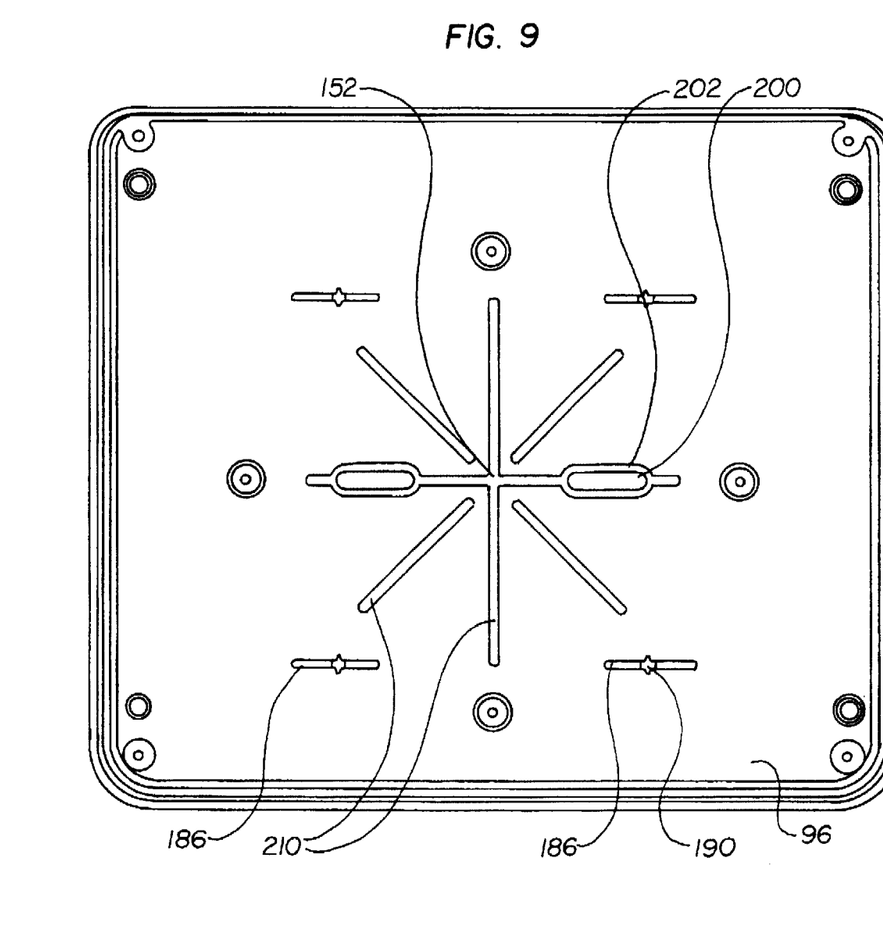
FIG. 9 is a front elevational view of the inside of the back panel of the door.
Figure 10A:
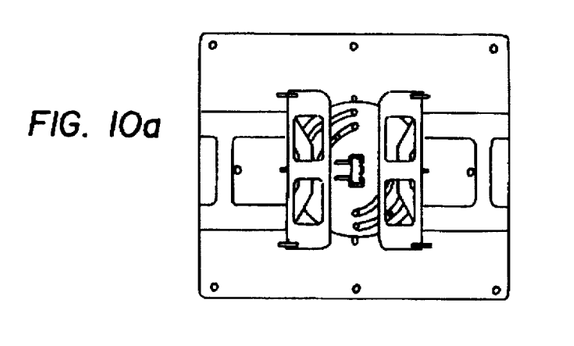
FIG. 10A is a schematic view of the door in a closed position.
Figure 10B:
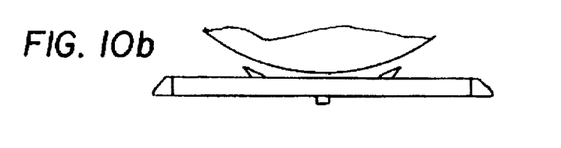
FIG. 10B is a schematic view illustrating the position of the wafer engaging arms.

The component parts are assembled as follows. Referring to FIGS. 2 and 9, the rear panel 96 of the door has four apertures 186 aligned as the corners of a rectangle. The rear panel has four cylindrically shaped pin members 190 positioned at each of the apertures and integral with the rear panel 96. The pin members 190 are appropriately sized to snap fit within the bell crank 113 to allow the rotation of the bell crank 113 on the pin member 190. The slot 174 of the bell crank 113 engages with the engaging arm actuator link 120 by way of a pin 194 in hinge 195. Each actuator link 120 has the cam follower 196 which engages with the wafer engaging arm cam surfaces 132 and also engage within recesses or grooves 200 formed in the rear panel 96. Said grooves are formed within raised projections 202 extending upwardly from the rear panel toward the front panel. Also extending upwardly from the rear panel 96 are a plurality of rotatable cam member support bars 210 upon which the rotatable cam member 80 rides. Said bars may have lugs 212 to facilitate holding the table cam member 110 in place. The embodiment of FIG. 7 utilizes slots 186 rather than the generally square apertures as shown in FIG. 2. Additionally, the pins 190 are positioned centrally in the slot 186 as opposed to the side of the aperture shown in FIG. 2.

Figure 11A:
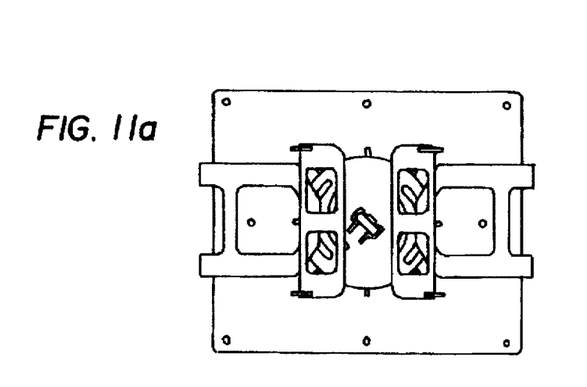
FIG. 11A is a schematic view of the door mechanism with the latching arms extended.
Figure 11B:
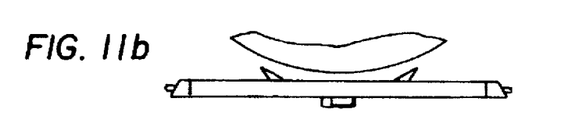
FIG. 11B is a schematic view of the wafer engagement arms in a proximal position not engaging the wafers corresponding to the mechanism position of FIG. 11A.
Figure 12A:
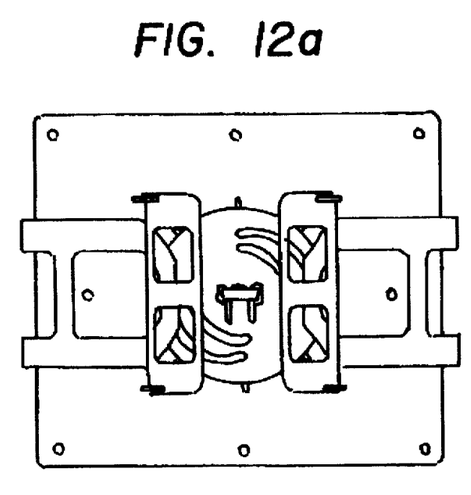
FIG. 12A is a schematic view of the mechanism in a fully latched position with the latching arms extended.
Figure 12B:
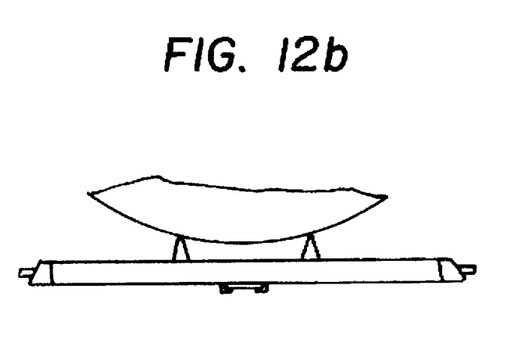
FIG. 12B is a schematic view corresponding to the mechanism position of FIG. 12A with the wafer engaging arms distally positioned and engaging the wafers.
Figure 13A:
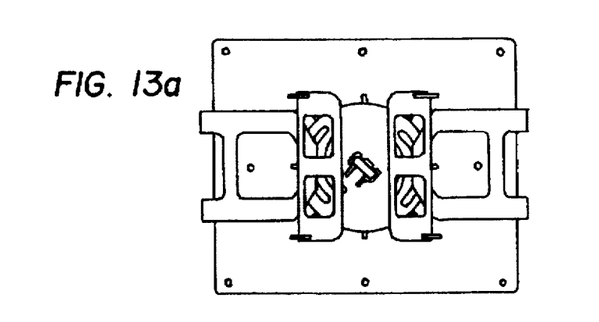
FIG. 13A is a schematic view of the door during a opening procedure with the latching arms fully extended.
Figure 13B:
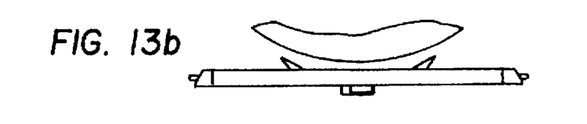
FIG. 13B corresponds to the mechanism position of FIG. 13A with the wafer engaging arms disengaged from the wafers in their proximal position.

The device operates as follows. Referring to FIG. 2 and the series of figures from FIGS. 10A and 10B through FIGS. 14A and 14B, the door is first placed within the door receiving frame 60 of the container portion 22 by way of manual or robotic means. The rotatable cammed member is rotated in a counter-clockwise configuration for the embodiment of FIG. 2. The engagement of the cam follower 166 of the latching arm with the cam surfaces 116 in the rotatable cammed member cause the latching arm to slidably extend outwardly due to the particularized shape of said cam aperture 114. As the latching arm 118 extends outwardly the latching portions 164 extend through the apertures 216 and into the slots 72, 74 on the vertical frame members of the door receiving frame 60. See specifically FIG. 11A. The wafer engaging arms are not extended at this point. Further rotation of the cammed wafer portion as shown in FIG. 12A does not further significantly move the latching arm 118 but does urge the cam followers 196 of the wafer engaging arm actuator links 120 outwardly thereby rotating the bell cranks 113 to translate the lateral motion of the actuator link 120 into an outward motion of the wafer engaging arm 112 toward the wafers. FIG. 12B thus shows the wafer engaging arms in a distal position with respect to the door enclosure and in a wafer engagement position. With the cam member rotated a full 90° counter-clockwise the cam followers 196 and 166 are moved past the detents 134, 122 thereby locking the cammed member in said position of FIGS. 12A and 12B. To unlatch and remove said door the cam member is rotated clockwise, first into the position as shown in FIGS. 13A and 13B in which the wafer engaging arms 112 are retracted away from the wafers and then to the proximal position as shown in FIGS. 13A and 13B where the latching arms 118 also are retracted out of the slots in the door receiving frame.

Figure 14A:
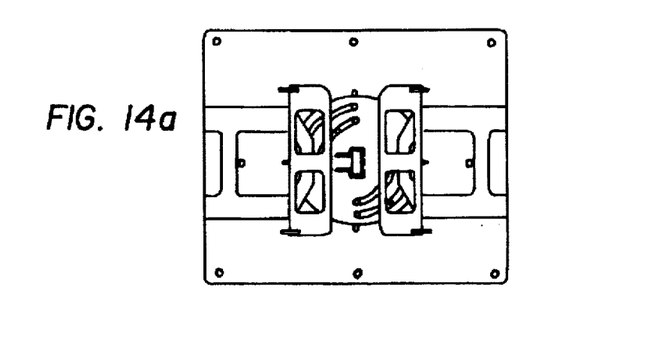
FIG. 14A is a schematic view of the door with the wafer mechanism returned to the fully unlatched position for opening said door.
Figure 14B:
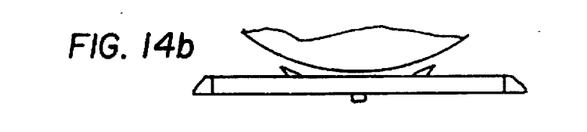
FIG. 14B corresponds to the mechanism position of FIG. 14A and shows the wafer engaging arms remaining disengaged from the wafers.
Figure 15:
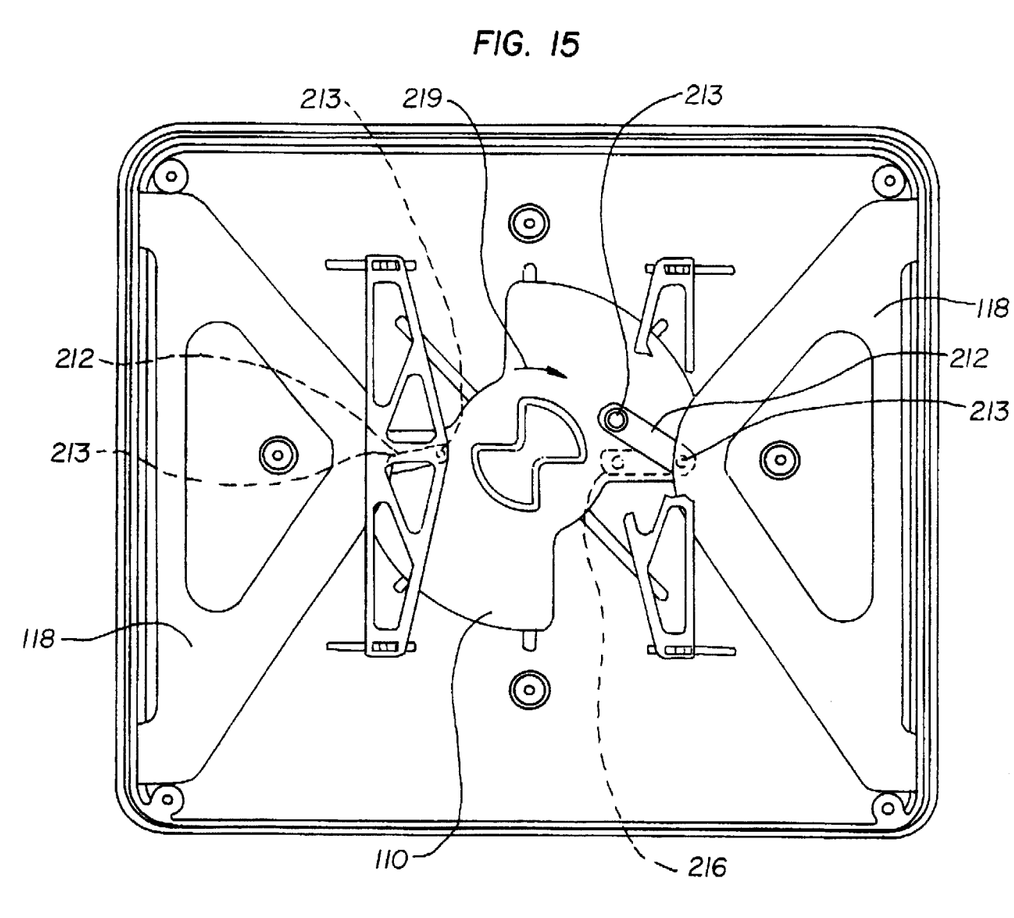

FIG. 14 shows an alternative embodiment of the invention in which the means for extending and retracting the latching portions and the means for moving the wafer engaging member between a proximal and distal position comprise linkages 211, 212 and joints 213 rather than the cam surfaces and cam followers. In such a configuration, the rotatable member 110 can be locked into the latching position by way of an overcenter position of link 212 as shown by the dotted lines labelled with the numeral 216. In the particular configuration shown in this figure, full actuation of the latching arm and wafer engaging arm are achieved with approximately 1/8 of a rotation of the rotatable member 110. The arrow 219 indicates the direction of rotation to fully extend the latching arms 118 and the wafer engaging arm 112, not shown in this view.

The individual parts of the door mechanism 100 may be suitably formed of carbon fiber polycarbonate to provide a static dissipative characteristic. The front panel and rear panel of the door may be formed of polycarbonate.

I claim:

1. A wafer container for holding circular wafers with edge portions in a horizontal axially aligned configuration, the container comprising a container portion and a cooperating door, the container portion comprising:

an open front, a closed left side, a closed backside, a closed right side, a closed top, a closed bottom, an open interior, and a generally rectangular door frame defining a door seat for receiving the door, whereby when the door is received by said door frame, said door confronts the edge portions of the wafers, the door frame having a latching portion;

the cooperating door comprising:

a door enclosure having an outer seating portion for engaging with the door frame, a rotatable cammed member within the enclosure and rotatably connected thereto, the cammed member rotatable from exterior of the enclosure, the cammed member having a latching arm cammed surface, and a wafer engaging cammed surface, an outwardly moveable latching arm having a cam follower engaged with the latching arm cammed surface, whereby when the cammed member is rotated the latching arm engages the latching portion of the door frame, a wafer engaging mechanism comprising an inwardly and outwardly moveable wafer engaging arm and an actuator arm connecting to the wafer engaging arm, the actuator arm having a cam follower engaged with the wafer engaging cammed surface, whereby when the cammed member is rotated the actuator arm extends the wafer engaging arm outwardly to engage the edge portions of the wafers thereby retaining said wafers.

2. The container of claim 1 wherein the door receiving frame has an aperture and the latching arm has an insertion portion, whereby the insertion portion is insertable into the aperture to latch said door to the container portion.

3. The container of claim 1 wherein the cammed surfaces are configured such that the latching arm engages the latching portion before the wafer engaging arm engages the edge portions of the wafers.

4. The container of claim 1, wherein the wafer engaging mechanism further comprises a bell crank pivotally connected to the door enclosure, the bell crank having two ends, one end connected to the wafer engaging arm and the other end connecting to the actuator arm whereby longitudinal movement of the actuator arm within the enclosure is translated to inward movement of the wafer engaging arm.

5. The container of claim 1 wherein at least one of the cammed surfaces has a detent positioned to retain the respective cam follower when the wafer engaging arm is extended.

6. A wafer container comprising a container portion with a door receiving frame defining a door opening, the door receiving frame having at least one latching aperture, the container further comprising a door, the door comprising a latching portion extendable into said latching aperture, a wafer engaging arm extendable from said door to engage wafers in said container, a door mechanism for latching the door to the door receiving frame, the mechanism configured to sequentially first extend the latching portion and to then extend said wafer engaging arm.

7. A latchable door for a wafer carrier, the wafer carrier having a door receiving frame with two opposing sides, each of said opposing sides having a recess, the door comprising:

a door enclosure having a outer edge portion with opposing edges, the outer edge portion sized for fitting within the door frame, the outer edge portion having at least two apertures on opposing edge portions positioned adjacent the recesses on the opposing sides of the door frame when the door is within the door frame, a rotatable member rotatably connected to the door enclosure, the rotatable member rotatable from exterior the enclosure, a pair of opposing sliding latching arms, each latching arm having a extendable latching portion adjacent one of the respective apertures, each of said extendable portions positioned to be extended and retracted through the respective aperture, an upright wafer engaging member positioned exterior the enclosure and moveable toward and away from the door enclosure, a first means connecting the rotatable member to the sliding latching arms for extending and retracting each of the latching portions through the respective aperture between an extended position and a retracted position as the rotatable member is rotated, and a second means for connecting the rotatable member to the upright wafer engaging member for moving the upright wafer engaging member between a position proximal the enclosure and a position distal from the enclosure as the rotatable member is rotated.

8. The wafer container door of claim 10 further comprising means for limiting the movement of said wafer engaging member away from the enclosure only when the extendable portions are not in the retracted position.

9. The wafer container door of claim 10 further including means for limiting the retraction of the extendable portions through the respective apertures only when the wafer engaging member is not positioned at the distal position.

* * * * *